United States Patent
Chen et al.

(10) Patent No.: US 8,314,543 B2
(45) Date of Patent: Nov. 20, 2012

(54) WHITE-LIGHT EMITTING DEVICE AND PREPARATION METHOD AND APPLICATION OF THE SAME

(75) Inventors: Yi-Jung Chen, Tucheng (TW); Chih-Chieh Yang, Tucheng (TW); Chin-Chang Shen, Tucheng (TW); Ru-Shi Liu, Tucheng (TW)

(73) Assignee: Everlight Electronics Co., Ltd., Tucheng, Taipei County (TW)

( * ) Notice: Subject to any disclaimer, the term of this patent is extended or adjusted under 35 U.S.C. 154(b) by 109 days.

(21) Appl. No.: 12/898,169

(22) Filed: Oct. 5, 2010

(65) Prior Publication Data

US 2011/0080086 A1 Apr. 7, 2011

(30) Foreign Application Priority Data

Oct. 5, 2009 (TW) ................................ 98133708 A

(51) Int. Cl.
*H01J 1/62* (2006.01)
(52) U.S. Cl. ........................................ 313/503; 313/498
(58) Field of Classification Search .................. 313/498, 313/501–506
See application file for complete search history.

(56) References Cited

U.S. PATENT DOCUMENTS

| | | | |
|---|---|---|---|
| 6,252,254 B1 * | 6/2001 | Soules et al. | 257/89 |
| 6,730,942 B2 | 5/2004 | Mabuchi et al. | |
| 2004/0063372 A1 | 4/2004 | Liu et al. | |
| 2007/0159062 A1 | 7/2007 | Tsai et al. | |

FOREIGN PATENT DOCUMENTS

| | | |
|---|---|---|
| EP | 1 013 740 A2 | 6/2000 |
| EP | 1 447 853 A1 | 8/2004 |
| EP | 1 830 415 A1 | 9/2007 |
| JP | 2-176760 | 7/1990 |

* cited by examiner

*Primary Examiner* — Vip Patel
(74) *Attorney, Agent, or Firm* — Patterson Thuente Christensen Pedersen, P.A.

(57) ABSTRACT

A white-light emitting device and its preparation method are provided. The white-light emitting device comprises an ultraviolet (UV) light emitting diode (LED) chip, a first phosphor, and a second phosphor, wherein the UV LED chip generates a first radiation; the first phosphor is composed of $Zn(C_3N_2H_4)_2$ powder and is excited by the first radiation to generate a second radiation; and the second phosphor is excited by the first radiation and/or the second radiation to generate a third radiation. The third radiation is then mixed with the first radiation and/or the second radiation to generate a white light.

16 Claims, 4 Drawing Sheets

WHITE-LIGHT EMITTING DEVICE AND PREPARATION METHOD AND APPLICATION OF THE SAME

This application claims priority to Taiwan Patent Application No. 098133708 filed on Oct. 5, 2009, the disclosures of which are incorporated herein by reference in their entirety.

CROSS-REFERENCES TO RELATED APPLICATIONS

Not applicable.

BACKGROUND OF THE INVENTION

1. Field of the Invention

The present invention provides a light emitting device and a preparation method of the same. In particular, the present invention provides a white-light emitting device and a preparation method of the same.

2. Descriptions of the Related Art

White light is a mixed light comprised of many colors. The light sensed by a human eye as white light comprises a mixed light of at least two wavelengths. For example, when a human eye is exposed to red, blue and green lights at the same time, or perceives blue and yellow lights at the same time, the eye perceives a white light. Thus, a white light emitting diode (LED) can be made according to this principle.

White light LEDs have been one of the most important and valued products in the world. Compared to conventional incandescent light bulbs, white light LEDs have the advantages of such as small in volume, emit no thermal radiation, consume low power, long service life and good reaction speed, and provide resolutions for many problems which were difficult for the incandescent light bulb to overcome in the past.

Accordingly, developed countries such as Europe, America, and Japan use white light LEDs as a new light source in the 21$^{st}$ century based on the common consensus of saving energy and protecting the environment. In Taiwan, about 11 billion kilowatts-hour of the power can be saved per year if a quarter of incandescent light bulbs and all fluorescent lamps are replaced by white light LEDs, which almost equals the yearly power generation of a nuclear power station. In view of this, it is clear that the benefit obtained from the development of white light LEDs is incredible. Therefore, developed countries such as Europe, America, and Japan have been invested a lot of manpower in the development of white light LEDs. It is expected that conventional lighting apparatuses will be replaced by white light LEDs in the following ten years.

The preparation method for white light LEDs was first developed by the Nichia Corporation, which mixed light of two wavelengths. In this method, a layer of yttrium aluminum garnet phosphor was coated on a blue light LED having a primary light emitting wavelength of 460 nm, and then the yttrium aluminum garnet phosphor was excited by the blue light LED to generate a yellow light having a primary wavelength of 555 nm, which is a complementary light of the blue light. The complementary lights, i.e., the yellow and the blue lights were mixed through the lens theory to obtain the desired white light.

Many people in the lighting industry are invested in developing a tri-wavelength light because the patent of the aforesaid preparing method is held by Nichia Corporation. The three primary color phosphors of blue, green, and red lights are excited by the UV light provided by an inorganic UV LED chip to generate the tri-wavelength light. If the ratio of the generated three primary color lights is exact, then the mixed light thereof will be a white light. However, to excite the various phosphors to generate fluorescence at the same time, one prerequisite condition is that the selected exciting light source must be absorbed by the fluorescence; the difference of the absorption coefficient for the exciting light between the phosphors cannot be too much; and the quantum efficiency of the photon conversion of the phosphors should also be as similar as possible. Obviously, the species of proper fluorescence materials are very limited. In addition to the difficult material selection, the color mixing equation for using three (or more) phosphors is a non-linear equation of second-order or more, based on the color mixing principle. In other words, its color change rate is two-dimensional or more than two-dimensional, and therefore, adjusting the ratio of the three primary color phosphors to obtain the white light is more difficult in technique.

In view of this, the present invention provides a white-light emitting device and a method for preparing the same, wherein only two species of phosphors are used to provide the desired white light.

SUMMARY OF THE INVENTION

An objective of the present invention is to provide a white-light emitting device, comprising an ultraviolet (UV) light emitting diode (LED) chip for generating a first radiation; a first phosphor being composed of $Zn(C_3N_2H_4)_2$ powders, wherein the first phosphor is excited by the first radiation and transforms a part of the first radiation into a second radiation having a longer wavelength; and a second phosphor, which is excited by the first radiation and/or the second radiation to generate a third radiation; and the third radiation is then mixed with the first radiation and/or the second radiation to generate a white light.

Another objective of the present invention is to provide a method for preparing the aforesaid white-light emitting device, comprising the following steps: providing an UV LED chip for generating a first radiation; providing a first phosphor and a second phosphor; and mixing the first phosphor and the second phosphor; wherein the first phosphor is composed of $Zn(C_3N_2H_4)_2$ powders and is excited by the first radiation to generate a second radiation; the second phosphor is excited by the first radiation and/or the second radiation to generate a third radiation; and the third radiation is mixed with the first radiation and/or the second radiation to generate a white light.

The aforesaid objectives, features and advantages of the present invention are further described in the following paragraphs with some embodiments.

DESCRIPTION OF THE PREFERRED EMBODIMENT

Figure 1:
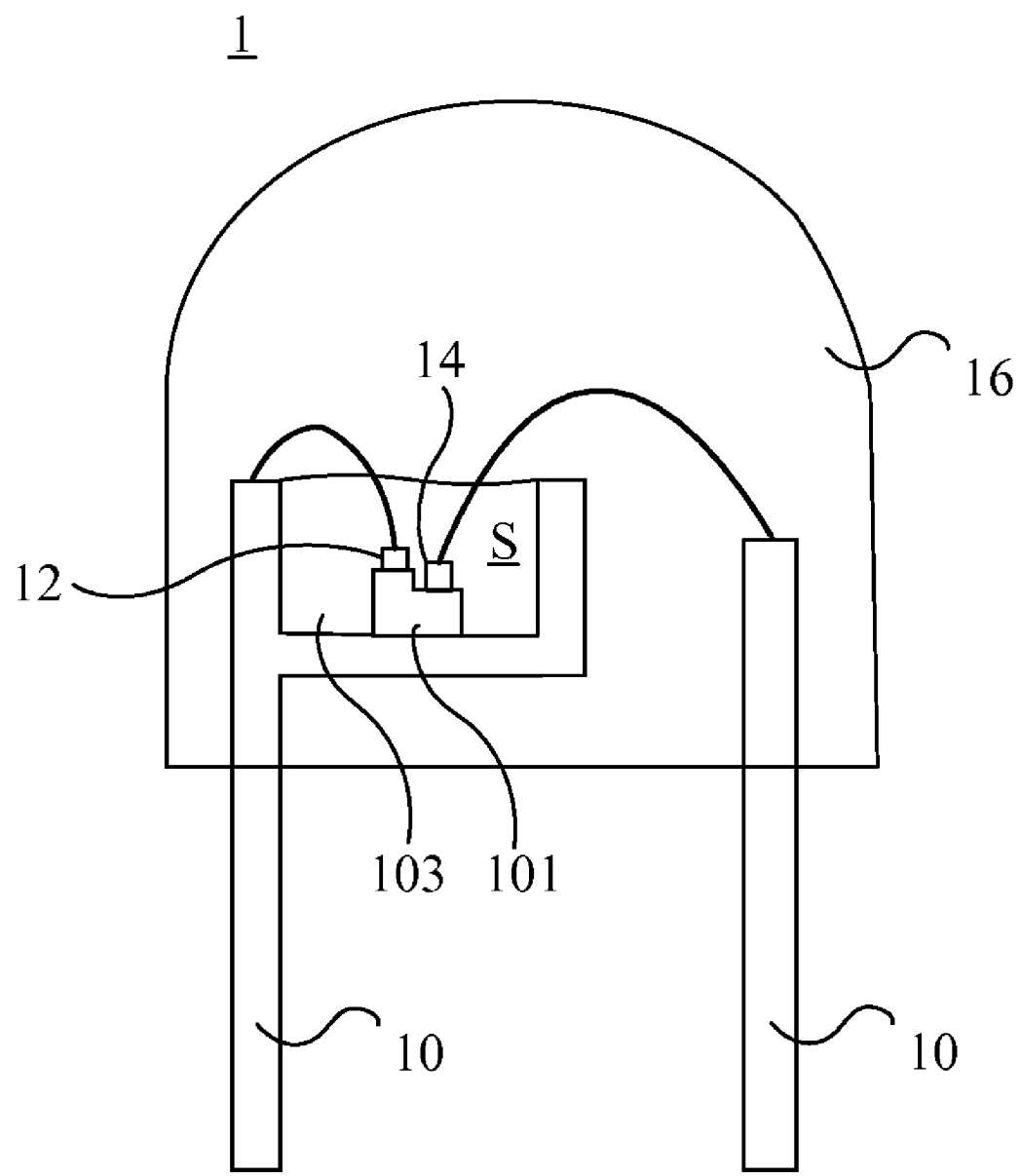
FIG. 1 is a light emitting device of an embodiment according to the present invention.

The following will specifically describe some embodiments of the present invention with the aid of figures. However, the present invention may be embodied in other embodiments without departing from the spirit of the present invention and should not be limited to the embodiments described in the specification. Moreover, the size of each element and area in the figures may be exaggerated and not drawn to real scale for clarity.

The white-light emitting device of the present invention comprises an UV LED chip for generating a first radiation; a first phosphor being composed of $Zn(C_3N_2H_4)_2$ powders, wherein the first phosphor is excited by the first radiation to transform a part of the first radiation into a second radiation having a longer wavelength; and a second phosphor, which is excited by the first radiation and/or the second radiation to generate a third radiation; and the third radiation is then mixed with the first radiation and/or the second radiation to generate a white light.

The first radiation provided by the UV LED chip may be any UV light that can excite the first phosphor to generate the second radiation. For example, the first radiation may be an UV light having a wavelength of about 350 nm to about 430 nm.

The second radiation, generated when the first phosphor is excited by the first radiation, is a blue light having a wavelength of about 300 nm to about 600 nm. In some embodiments of the present invention, the primary wavelength of the second radiation is about 440 nm.

The third radiation may be any yellow light that can be mixed with the first radiation and/or the second radiation to obtain the desired white light. In some embodiments of the present invention, the third radiation is generated when the second phosphor is excited by the second radiation and has a wavelength of about 500 nm to about 700 nm. The primary wavelength of the third radiation is about 570 nm.

Furthermore, in some embodiments of the light emitting device of the present invention, the color temperature of the provided white light is about 6,000K to about 7,500K.

The second phosphor useful in the present invention may be any phosphor that can be excited by the first radiation or the second radiation to generate the third radiation, which can be mixed with the first radiation or the second radiation to generate the white light. In general, the second phosphor comprises the following: (i) one or more elements selected from a group consisting of Be, Ma, Ca, Sr, and Ba; (ii) one or more elements selected from a group consisting of C, Si, Ge, Sn, Ti, Zr, and Hf; and (iii) an activator selected from rare earth elements (such as europium (Eu)) for improving the light emitting efficiency. For example, the second phosphor may be represented by the formula of $MSiO_4$:R or $MSi(OCl)_4$:R, wherein M is one or more II-group elements selected from a group consisting of Ca, Sr, and Ba, and R is Eu ion, but not limited thereto. The second phosphor, for example, may be $(SrBa)_2SiO_4$:$Eu^{2+}$ or $(SrBa)_2Si(OCl)_4$:$Eu^{2+}$, wherein $(SrBa)_2SiO_4$:$Eu^{2+}$ is used in some embodiments of the present invention.

The mixing weight ratio of the first phosphor and the second phosphor may be optionally adjusted to obtain the desired white light. In general, the mixing weight ratio of the first phosphor and the second phosphor is about 1:2 to about 1:6. In some embodiments of the present invention, the mixing weight ratio of the first phosphor and the second phosphor is about 1:4. The resultant phosphor mixture is blended with a silica gel in a weight ratio of about 0.25:1, for example, and the resultant blend provides a phosphor layer 103.

The following will further describe the white-light emitting device of the present invention with the aid of FIG. 1.

FIG. 1 illustrates a white-light emitting device 1 comprising a holder 10, an UV LED chip 101, a phosphor layer 103 and a packaging layer 16. The phosphor layer 103 is formed by mixing the first phosphor and the second phosphor in a proper ratio, and then blending the resultant mixture with the packaging resin material. The holder 10 has a containing space S, while the UV LED chip 101 is placed in the containing space S. The phosphor layer 103 is filled in the containing space S, while the UV LED chip 101 is wrapped by the phosphor layer 103. The phosphor layer 103 is not limited to the figure, and the phosphor layer 103 may be conformally formed on the UV LED chip 101. Furthermore, the UV LED chip 101 has a first electrode 12 and a second electrode 14 electrically connected to the holder 10 to provide power for the UV LED chip 101. The packaging layer 16 covers the phosphor layer 103 and a part of the holder 10. For example, the material of the packaging layer 16 may be epoxy resin.

The present invention also provides a method for preparing the aforesaid white-light emitting device. The method comprises the following: providing an UV LED chip for generating a first radiation; providing a first phosphor, which is an organic metal complex $Zn(C_3N_2H_4)_2$ powder; providing a second phosphor; and mixing the first phosphor and the second phosphor. The first phosphor is excited by the first radiation to generate a second radiation; the second phosphor is excited by the first radiation and/or the second radiation to generate the third radiation; and the third radiation is mixed with the first radiation and/or the second radiation to generate a white light. The characteristics and the selecting conditions of the first phosphor, the second phosphor and the UV LED chip are described above.

The first phosphor of the present invention may be prepared by any suitable method, such as a hydrothermal method, a solid-gaseous sintering method, a sol-gel method, a direct reaction method, or an organic metal thermal decomposition method. In one embodiment, the first phosphor is prepared by the hydrothermal method. The hydrothermal method uses water as a medium and generates a pressure in a sealed reactor by applying a suitable temperature to perform the reaction. First, the reactant and water are placed in a sealed reactor. After fastening and sealing the reactor, it is placed in a heating furnace for heating to perform the reaction. The temperature used is usually ranging from about 130° C. to about 250° C. One advantage of the hydrothermal method is that the crystal powders may be obtained directly without high-temperature sintering, and therefore, the grinding step may be omitted and the impurities produced thereby may also be excluded. The particle size of the resultant powders is usually about few microns to about several tens of nanometers, and the resultant powders usually have advantages such as good crystallization, low aggregation, high purity, narrow particle size distribution, and controllable topography in most situations.

Similarly, the aforesaid proper known method also may be used to prepare the second phosphor of the present invention. For example, a silicate type phosphor may be prepared by the solid sintering method as follows: a carbonate (such as $BaCO_3$, $SrCO_3$) is mixed with silicon dioxide and an optional metal chloride (such as $EuCl_2$, for providing the activator); a high-temperature sintering step is then performed, i.e., the resultant mixture is placed in a crucible and heated to a temperature for dissolving the carbonate; a reductive gas is subsequently introduced into the crucible and it is heated to a higher temperature; the resultant product, along with the crucible, is placed into a solution (such as acetic acid solution), and then is dried to obtain the desired phosphor powders.

The white-light emitting device of the present invention may be prepared by any suitable method. For example, in reference to FIG. 1 again, the UV LED chip 101 is fixed in the containing space S of the holder 10, and then the mixture containing the first phosphor and the second phosphor is filled in the containing space S as the phosphor layer 103, wherein the UV LED chip 101 is electrically connected to the holder 10 through the first electrode 12 and the second electrode 14. The packaging layer 16 is then formed by using any suitable packaging method and packaging material (such as epoxy resin), and the white light LED 1 shown in FIG. 1 is obtained thereby. The detailed operation is described in the following embodiment.

The present invention will be further described with the specific embodiment.

EXAMPLE

Preparation of Phosphor

The first phosphor was prepared by the following steps: about 0.6 g of imidazole (IMZ) compound, about 1.151 g of hydrated zinc acetate ($Zn(NO_3)2.4H_2O$), and 80 ml of dimethyl formamide (DMF) were placed in a sealed reactor; the hydrothermal method was performed to prepare the first phosphor, wherein the temperature was raised to about 130° C. with a temperature raising rate of about 5° C./minute; the temperature was substantially held for about 24 hours and then naturally dropped to room temperature; a drying process was subsequently performed; the solvent was initially removed to produce an organic metal complex $Zn(C_3N_2H_4)_2$ crystal and the resultant crystal was then placed in a 85° C. oven under a vacuum condition for drying for 24 hours to prepare organic metal complex $Zn(C_3N_2H_4)_2$ powders.

Measurement of Light Emitting Spectrum

Figure 2A:
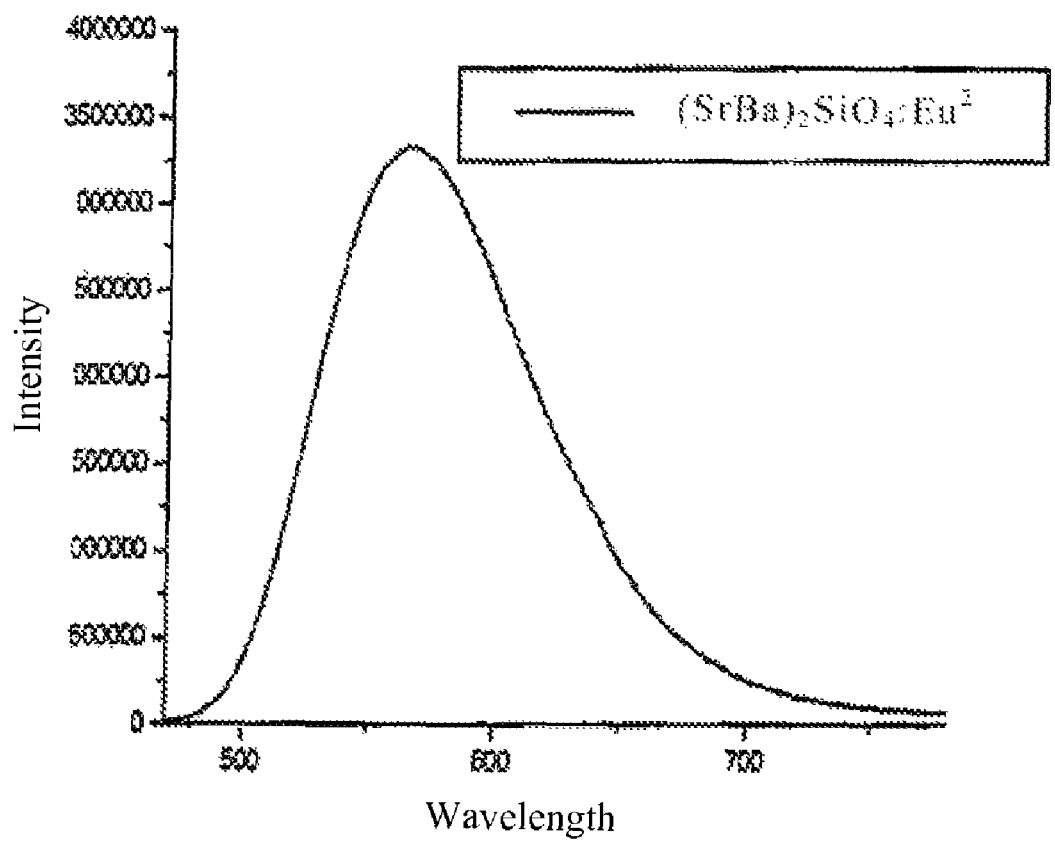
FIG. 2A is a light emitting spectrum of $(SrBaEu)_2SiO_4$ powders excited by the UV light.
Figure 2B:
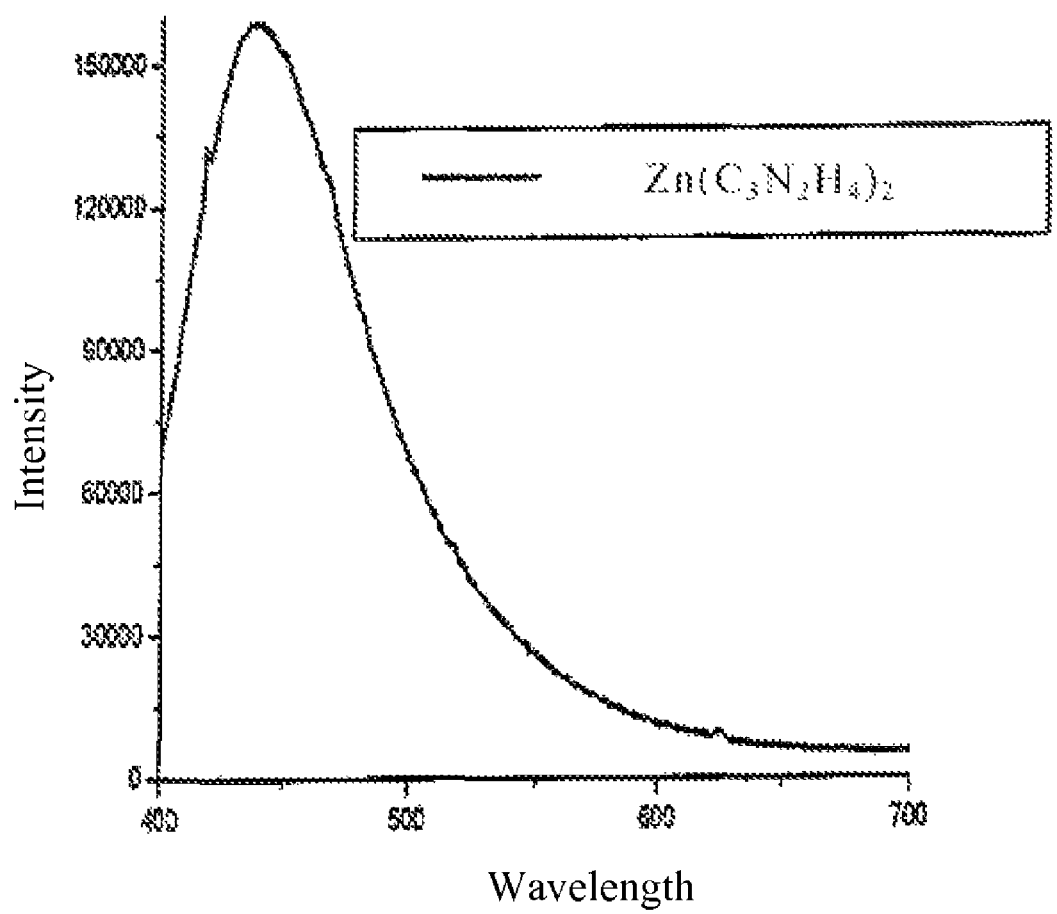
FIG. 2B is a light emitting spectrum of organic metal complex $Zn(C_3N_2H_4)_2$ powders according to the present invention excited by the UV light.
Figure 3:
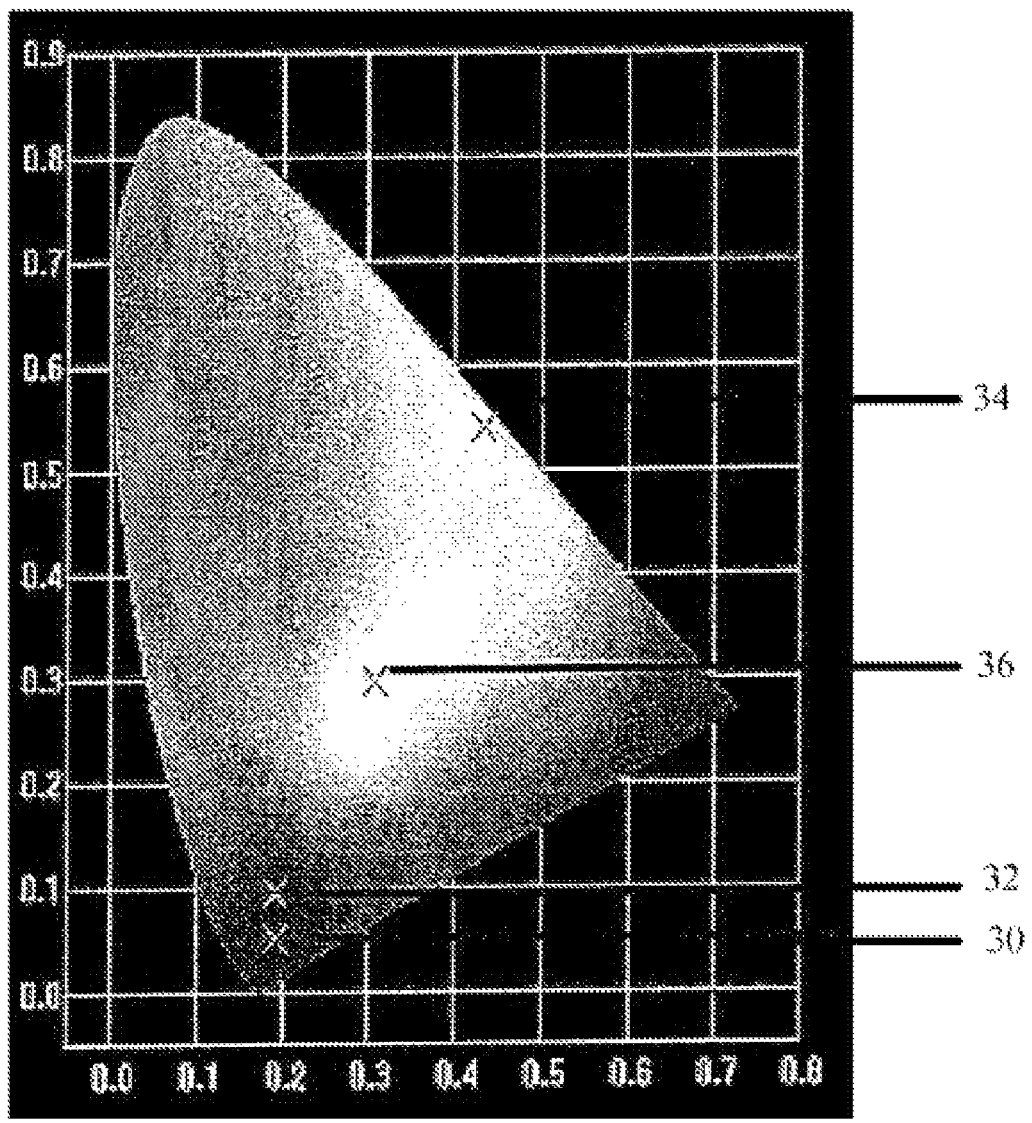
FIG. 3 is a CIE coordinate diagram.

The UV LED chip having a primary wavelength of about 350 nm to about 430 nm was used as an exciting source to excite the $(SrBa)_2SiO_4:Eu^{2+}$ powders and the organic metal complex $Zn(C_3N_2H_4)_2$ powders individually. The resultant light emitting spectrums are shown in FIG. 2A and FIG. 2B, respectively. Referring to the figures, the first phosphor excited by the UV LED chip could generate a blue fluorescence, while the second phosphor excited by the UV LED chip could generate a yellow fluorescence. As shown in FIG. 3, the data of the aforesaid light emitting spectrums were transferred into the CIE coordinates of the phosphors through the formula of CIE coordinate diagram established by the International Commission on Illumination in 1931, wherein the number 30 represents the CIE coordinate of the UV LED chip, the number 32 represents the CIE coordinate of the first phosphor, and the number 34 represents the CIE coordinate of the second phosphor.

Preparation of Light Emitting Device

The white light emitting device 1 shown in FIG. 1 used the UV LED chip 101 having a primary wavelength of about 350 nm to about 430 nm. The phosphor layer 103 used therein was prepared by the following steps: the organic metal complex $Zn(C_3N_2H_4)_2$ powders were mixed with $(SrBaEu)_2SiO_4$ powders in a weight ratio of about 4:1; the resultant mixture was then mixed with silica gel; and epoxy resin was used as the material of the packaging layer 16.

The holder 10 was connected to a circuit board. An energizing test was performed, and the color temperature and the CIE coordinate obtained thereby were recorded in Table 1 and marked in FIG. 4 as number 36 for its coordinate position.

TABLE 1

| | Color temperature (K) | Luminance intensity (mcd) | CIE coordinate (X-axis) | CIE coordinate (Y-axis) |
| --- | --- | --- | --- | --- |
| Example | 7115 | 19.6 | 0.309 | 0.295 |

It is known from Table 1 and the CIE coordinate 36 in FIG. 3 that the white-light emitting device of the present invention can indeed provide a white light source.

Given the above, the white-light emitting device of the present invention can efficiently provide the white light source. Because only two phosphors are used in the present invention, the cost is cheaper and the technique of adjusting the ratio of phosphors to obtain the white light is much easier.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A white-light emitting device, comprising:
   an ultraviolet (UV) light emitting diode (LED) chip for generating a first radiation;
   a first phosphor being composed of $Zn(C_3N_2H_4)_2$ powders, wherein the first phosphor is excited by the first radiation and transforms a part of the first radiation into a second radiation having a longer wavelength; and
   a second phosphor, which is excited by the first radiation and/or the second radiation to generate a third radiation, and the third radiation is mixed with the first radiation and/or the second radiation to generate a white light.

2. The white-light emitting device of claim 1, wherein the second phosphor comprises at least one element selected from a group consisting of Be, Mg, Ca, Sr, and Ba; at least one element selected from a group consisting of C, Si, Ge, Sn, Ti, Zr, and Hf; and an activator selected from rare earth elements.

3. The white-light emitting device of claim 2, wherein the activator is europium (Eu) ion.

4. The white-light emitting device of claim 2, wherein the second phosphor is represented by the formula of $MSiO_4:R$ or $MSi(OCl)_4:R$, wherein M is at least one II-group element selected from a group consisting of Ca, Sr, and Ba, and R is Eu ion.

5. The white-light emitting device of claim 4, wherein the second phosphor is $(SrBa)_2SiO_4:Eu^{2+}$ or $(SrBa)_2Si(OCl)_4:Eu^{2+}$.

6. The white-light emitting device of claim 1, wherein the weight ratio of the first phosphor and the second phosphor is about 1:2 to about 1:6.

7. The white-light emitting device of claim 6, wherein the weight ratio of the first phosphor and the second phosphor is about 1:4.

8. The white-light emitting device of claim 1, wherein the color temperature of the white light thereby provided is about 6,000K to about 7,500K.

9. The white-light emitting device of claim 1, wherein the wavelength of the first radiation is about 350 nm to about 430 nm, and the wavelength of the second radiation is about 300 nm to about 600 nm.

10. The white-light emitting device of claim 9, wherein the wavelength of the first radiation is about 350 nm to about 430 nm, and the wavelength of the second radiation is about 440 nm.

11. The white-light emitting device of claim 9, wherein the second phosphor is excited by the second radiation, and the wavelength of the third radiation is about 500 nm to about 700 nm.

12. The white-light emitting device of claim 1, further comprising a holder with a containing space, wherein the UV LED chip is placed in the space.

13. The white-light emitting device of claim 12, wherein the first phosphor and the second phosphor are filled in the containing space, and the UV LED chip is wrapped by the first phosphor and the second phosphor.

14. The white-light emitting device of claim 13, wherein the second phosphor is represented by the formula of $MSiO_4$:R or $MSi(OCl)_4$:R, wherein M is at least one II-group element selected from a group consisting of Ca, Sr, and Ba, and R is Eu ion.

15. The white-light emitting device of claim 12, wherein the first phosphor and the second phosphor are conformally formed on a light-emitting surface of the UV LED chip.

16. The white-light emitting device of claim 12, wherein the UV LED chip has two electrodes electrically connected to the holder individually.

\* \* \* \* \*